(12) United States Patent
Kishimoto et al.

(10) Patent No.: US 11,655,087 B2
(45) Date of Patent: May 23, 2023

(54) BARRIER RESIN FILM, BARRIER LAMINATE AND PACKAGING MATERIAL USING BARRIER LAMINATE

(71) Applicant: DAI NIPPON PRINTING CO., LTD., Tokyo (JP)

(72) Inventors: Yoshihiro Kishimoto, Tokyo (JP); Azusa Suzuki, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 489 days.

(21) Appl. No.: 16/982,380

(22) PCT Filed: Mar. 20, 2019

(86) PCT No.: PCT/JP2019/011721
§ 371 (c)(1),
(2) Date: Sep. 18, 2020

(87) PCT Pub. No.: WO2019/182018
PCT Pub. Date: Sep. 26, 2019

(65) Prior Publication Data
US 2021/0002050 A1 Jan. 7, 2021

(30) Foreign Application Priority Data
Mar. 23, 2018 (JP) .............................. JP2018-056339

(51) Int. Cl.
*B65D 65/42* (2006.01)
*C23C 14/02* (2006.01)
(Continued)

(52) U.S. Cl.
CPC ................ *B65D 65/42* (2013.01); *B32B 9/00* (2013.01); *B32B 9/041* (2013.01); *B32B 15/00* (2013.01);
(Continued)

(58) Field of Classification Search
CPC .......... B65D 65/42; B65D 65/40; B32B 9/00; B32B 9/041; B32B 15/00; B32B 15/04;
(Continued)

(56) References Cited

FOREIGN PATENT DOCUMENTS

| CN | 107073889 | 8/2017 |
|---|---|---|
| EP | 1 787 796 | 5/2007 |

(Continued)

OTHER PUBLICATIONS

Office Action issued for Chinese Patent Application No. 201980020702.7, dated May 10, 2022, 12 pages including machine translation.
(Continued)

*Primary Examiner* — James C Yager
(74) *Attorney, Agent, or Firm* — Hamre, Schumann, Mueller & Larson, P.C.

(57) ABSTRACT

The present invention addresses the problem of providing a barrier resin film exhibiting excellent barrier properties without adopting a multilayer structure such as the structures used by the prior art. A barrier resin film obtained by forming a vapor-deposited aluminum oxide film on the surface of a resin substrate, wherein an elementally bonded structural unit represented by $Al_3$ is distributed in the vapor-deposited aluminum oxide film, and the intensity ratio ($Al_3/Al_2O_3 \times 100$) of the maximum $Al_3$ concentration elementally bonded structure section according to Time-of-Flight secondary ion mass spectrometry (TOF-SIMS) is 1-20, inclusive.

14 Claims, 2 Drawing Sheets

(51) Int. Cl.
*C23C 14/08* (2006.01)
*C23C 14/24* (2006.01)
*B32B 9/00* (2006.01)
*B32B 27/36* (2006.01)
*B32B 15/00* (2006.01)
*B32B 9/04* (2006.01)
*B32B 15/04* (2006.01)
*B32B 27/08* (2006.01)
*B32B 15/08* (2006.01)
*B32B 15/09* (2006.01)

(52) U.S. Cl.
CPC .............. *B32B 15/04* (2013.01); *B32B 27/08* (2013.01); *B32B 27/36* (2013.01); *C23C 14/02* (2013.01); *C23C 14/081* (2013.01); *C23C 14/24* (2013.01); *B32B 15/08* (2013.01); *B32B 15/09* (2013.01); *B32B 2255/10* (2013.01); *B32B 2255/20* (2013.01); *B32B 2255/26* (2013.01); *B32B 2255/28* (2013.01); *B32B 2307/31* (2013.01); *B32B 2307/724* (2013.01); *B32B 2307/7242* (2013.01); *B32B 2307/7244* (2013.01); *Y10T 428/1352* (2015.01)

(58) Field of Classification Search
CPC ......... B32B 27/08; B32B 27/36; B32B 15/08; B32B 15/09; B32B 2255/10; B32B 2255/20; B32B 2255/26; B32B 2255/28; B32B 2307/31; B32B 2307/724; B32B 2307/7242; B32B 2307/7244; B32B 7/027; B32B 27/18; C23C 14/081; C23C 14/24; C23C 14/02; C23C 14/0021; C23C 14/022; C23C 16/40; C23C 18/2026; C23C 18/22; Y10T 428/1352; C08J 2367/02; C08J 2423/08; C08J 2429/04; C08J 7/048; C08J 7/0423; C08J 7/123; Y02P 20/582; C08L 2207/20; C08K 3/22; C08K 5/54; C09D 7/61; C09D 7/63
See application file for complete search history.

(56) References Cited

FOREIGN PATENT DOCUMENTS

| | | |
|---|---|---|
| EP | 3 202 568 | 8/2017 |
| JP | 2005-324469 | 11/2005 |
| JP | 2007-210262 | 8/2007 |
| JP | 2008-006762 | 1/2008 |
| JP | 2011-042147 | 3/2011 |
| JP | 2012-096469 | 5/2012 |
| JP | 2013-082106 | 5/2013 |
| JP | 2017-081175 | 5/2017 |
| JP | 2019-155646 | 9/2019 |
| WO | 02/083408 | 10/2002 |
| WO | 2003/009998 | 2/2003 |
| WO | 2008/122293 | 10/2008 |
| WO | 2013/100073 | 7/2013 |
| WO | 2014/050951 | 4/2014 |
| WO | 2019/087960 | 5/2019 |

OTHER PUBLICATIONS

Office Action issued for Japanese Patent Application No. 2020-507876, dated Nov. 22, 2022, 6 pages including machine translation.

The extended European search report issued for European patent application No. 19772453.7, dated May 6, 2021, 8 pages.

International Preliminary Report on Patentability of PCT/JP2019/011721, dated Oct. 8, 2020, 8 pages.

International Search Report and Written Opinion of PCT/JP2019/011721, dated Jun. 11, 2019, 10 pages including English translation of International Search Report.

Office Action issued for Chinese Patent Application No. 201980020702.7, dated Dec. 9, 2021, 16 pages including machine translation.

[Fig.1]
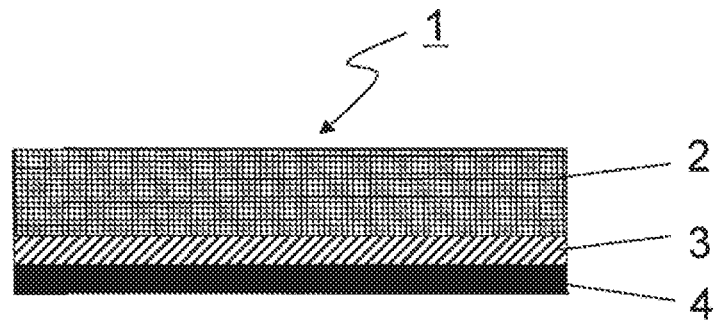
[Fig.2]
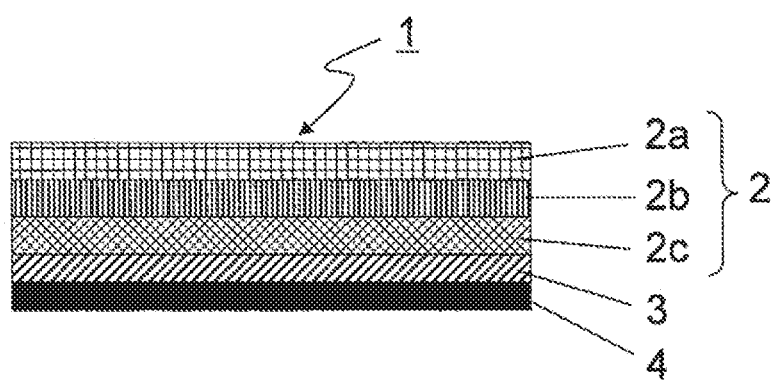
[Fig.3]
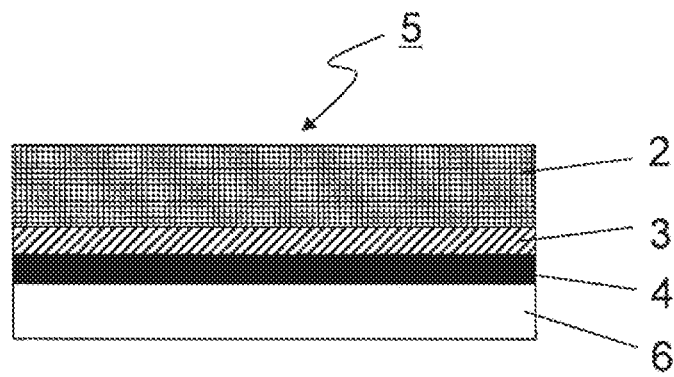

[Fig.4]
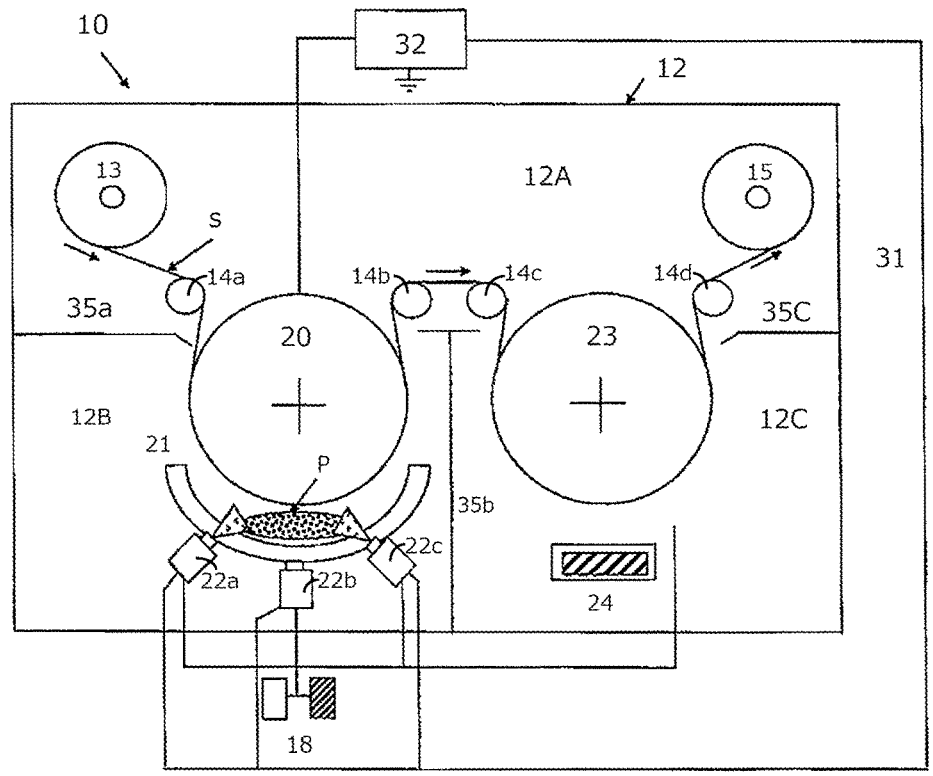
[Fig.5]
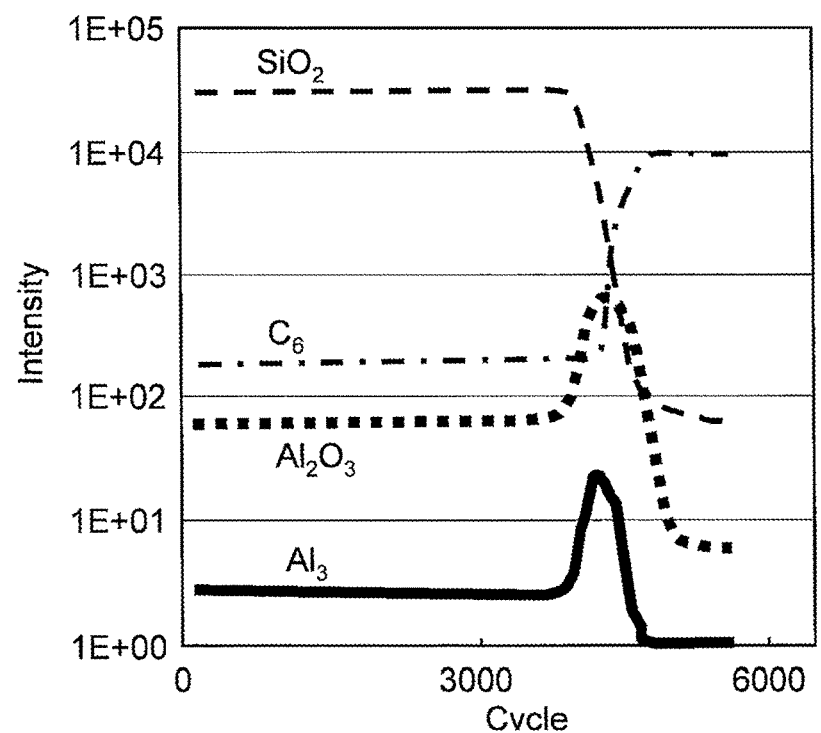

BARRIER RESIN FILM, BARRIER LAMINATE AND PACKAGING MATERIAL USING BARRIER LAMINATE

TECHNICAL FIELD

The present invention relates to a barrier resin film and a barrier laminate excellent in a barrier property against oxygen and steam that can be suitably used as a packaging material for an electronic device such as electronic paper, food, drugs and pet food, and a packaging material using the barrier laminate.

BACKGROUND ART

In the fields of electronic devices such as electronic paper, food, drugs, and the like, a barrier laminate film that is not affected by temperature and humidity and is capable of stably exhibiting a higher barrier property is required so that change of the quality of a content can be prevented as well as the function and properties can be retained, and a barrier laminate film having a layered structure in which a barrier layer of a thin film such as a deposited film of silicon oxide or aluminum oxide and a barrier coating layer are laminated on a resin substrate has been developed.

For example, Patent Literature 1 discloses a laminate including a substrate of a plastic material, a first deposited thin film layer provided on the substrate, a gas barrier intermediate layer provided on the first deposited thin film layer and formed by coating a coating layer containing at least a water-soluble polymer, and a second deposited thin film layer provided on the intermediate layer, and further discloses a gas barrier laminate including a primer layer containing polyol, an isocyanate compound and a silane coupling agent provided between the substrate and the first deposited thin film layer.

Patent Literature 2 discloses a high barrier sheet including a substrate film of a synthetic resin, a first planarization layer laminated on at least one surface of the substrate film, a gas barrier layer laminated on an outer surface of the first planarization layer and formed from an inorganic oxide or inorganic nitride, and a planarization layer formed by a sol gel method using a composition containing another metal alkoxide and/or a hydrolyzate thereof and laminated on an outer surface of the gas barrier layer.

Patent Literature 3 discloses a gas barrier laminate film including a metal oxide layer, a resin layer and a metal layer laminated in the stated or reverse order on a resin film, in which the metal oxide layer contains silicon oxide represented by $SiO_x$ ($1.0 \leq x \leq 2.0$).

These barrier laminate films having the layered structures, however, not only simply increase cost due to raw material cost and equipment operating cost increased by increase of production procedures but also require complicated operations for quality check for each layer, and for correction of quality management and historical management based on the check.

Therefore, there is a demand for a barrier film that solves the above-described problems in production, does not cause deterioration of productivity, and is excellent in a barrier property.

CITATION LIST

Patent Literature

[Patent Literature 1] WO2002/083408
[Patent Literature 2] Japanese Patent Laid-Open No. 2005-324469
[Patent Literature 3] Japanese Patent Laid-Open No. 2008-6762

SUMMARY OF INVENTION

Technical Problem

The present invention has been devised to solve the above-described problems, and an object is to provide a barrier resin film attaining an excellent barrier property without employing a layered structure as in the conventional techniques.

Solution to Problem

In order to achieve the object, a barrier resin film of the present invention includes a resin substrate, and an aluminum oxide deposited film, formed on the resin substrate, in which an elemental bond structure represented by $Al_3$ is locally distributed in a specific ratio.

The ratio of the elemental bond structure represented by $Al_3$ is detected by performing etching by time-of-flight secondary ion mass spectrometry (TOF-SIMS) on a barrier resin film, and a maximum intensity ratio $Al_3/Al_2O_3 \times 100$ is preferably 1 or more and 20 or less.

Specifically, the present invention has the following characteristics:

1. A barrier resin film including an aluminum oxide deposited film formed on a surface of a resin substrate, and a barrier coating layer adjacently formed on a surface of the aluminum oxide deposited film opposite to the resin substrate, wherein an elemental bond structure represented by $Al_3$ is distributed in the aluminum oxide deposited film, and an intensity ratio, $Al_3/Al_2O_3 \times 100$, of a maximum $Al_3$ concentration elemental bond structure in the aluminum oxide deposited film obtained by analyzing the barrier resin film by time-of-flight secondary ion mass spectrometry (TOF-SIMS) is 1 or more and 20 or less.

2. The barrier resin film according to 1 above, wherein the maximum $Al_3$ concentration elemental bond structure is present in a depth position of 4% or more and 45% or less in a thickness of the aluminum oxide deposited film from the surface of the aluminum oxide deposited film opposite to the resin substrate.

3. The barrier resin film according to 1 or 2 above, wherein the surface of the resin substrate where the aluminum oxide deposited film is formed is an oxygen plasma treated surface.

4. The barrier resin film according to 3 above, wherein the aluminum oxide deposited film is formed in-line on the oxygen plasma treated surface.

5. The barrier resin film according to any of 1 to 4 above, wherein the resin substrate contains a polyethylene terephthalate-based resin.

6. The barrier resin film according to any of 1 to 5 above, wherein the resin substrate contains a polybutylene terephthalate-based resin.

7. The barrier resin film according to any of 1 to 6 above, wherein the resin substrate contains a plant-derived polyester-based resin.

8. The barrier resin film according to any of 1 to 7 above, wherein the resin substrate contains a recycled polyester-based resin.

9. The barrier resin film according to any of 1 to 8 above, wherein the barrier coating layer is formed from a resin composition containing a metal alkoxide, and a hydroxyl group-containing water-soluble resin having a saponification degree of 90% or more and 100% or less.

10. The barrier resin film according to 9 above, wherein a mass ratio between the hydroxyl group-containing water-soluble resin and the metal alkoxide, the hydroxyl group-containing water-soluble resin/the metal alkoxide, is 5/95 or more and 20/80 or less.

11. The barrier resin film according to 9 or 10 above, wherein the barrier coating layer has a thickness of 150 nm or more and 800 nm or less.

12. A barrier laminate including the barrier resin film according to any of 1 to 11 above, and a sealant layer.

13. A barrier packaging material produced from the barrier laminate according to 12 above.

14. A barrier package produced from the barrier packaging material according to 13 above.

Advantageous Effects of Invention

According to the present invention, a barrier resin film having an excellent barrier property can be obtained without employing a layered structure, and hence a gas barrier film advantageous in production can be provided.

BRIEF DESCRIPTION OF DRAWINGS

FIG. 1 is a cross-sectional view illustrating an example of a barrier resin film of the present invention.

FIG. 2 is a cross-sectional view illustrating an example of another aspect of the barrier resin film of the present invention.

FIG. 3 is a cross-sectional view illustrating an example of a barrier laminate of the present invention.

FIG. 4 is a plan view illustrating an example of an apparatus used for forming an aluminum oxide deposited film of the present invention.

FIG. 5 is an analytic graph illustrating an example of a measurement result obtained by TOF-SIMS of the barrier resin film of the present invention.

DESCRIPTION OF EMBODIMENTS

Hereinafter, the present invention will be described with reference to the accompanying drawings. It is noted that the present invention is not limited to forms specifically exemplified herein or various structures specifically described herein.

It is noted that the size or the proportion of each member may be changed or exaggerated in each drawing in some cases so as to be easily understood. Besides, a portion unnecessary for description and repeated signs may be omitted for clarity in some cases.

<Barrier Resin Film>

A barrier resin film of the present invention includes, as illustrated in FIG. 1, a layer of a resin substrate, an aluminum oxide deposited film formed on the layer of the resin substrate, and a barrier coating layer formed on and adjacent to the aluminum oxide deposited film.

Although not illustrated in the drawing, various functional layers can be laminated if necessary on a surface of the resin substrate where aluminum oxide is not to be deposited, or on a surface of the barrier coating layer that is not adhered to aluminum oxide.

The aluminum oxide deposited film of the present invention is not a genuine aluminum oxide deposited film but an elemental bond structure represented by $Al_3$ is distributed in the deposited film. In detail, an $Al_3$ concentration elemental bond structure corresponding to the presence of metal aluminum is detected by time-of-flight secondary ion mass spectrometry (TOF-SIMS) on a barrier resin film, and the concentration thereof is obtained as a detection intensity. As a characteristic of the barrier resin film of the present invention, a maximum intensity ratio, $Al_3/Al_2O_3 \times 100$, of a maximum $Al_3$ concentration elemental bond structure corresponding to the maximum value of the intensity is 1 or more and 20 or less.

When the intensity ratio $Al_3/Al_2O_3$ is lower than this range, an amount of the elemental bond structure represented by $Al_3$ in the deposited film is so small that a gas barrier property is easily deteriorated. When it is higher than this range, transparency of the deposited film is easily deteriorated, and hence, printability as a packaging material is impaired, and in addition, there easily arises a problem, as the packaging material, of poor visibility of a packaged content.

Alternatively, when the barrier resin film includes the barrier coating layer, a barrier property of oxygen permeability of 0.02 $cc/m^2/day/atm$ or more and 0.2 $cc/m^2/day/atom$ or less and steam permeability of 0.02 $g/m^2/day$ or more and 0.2 $g/m^2/day$ or less can be exhibited.

[Resin Substrate]

The resin substrate is not especially limited, and a known resin film or sheet can be used. For example, a resin film containing a polyester-based resin including a polyethylene terephthalate-based resin, a biomass-derived polyester, a polybutylene terephthalate-based resin, a polyethylene naphthalate-based resin or the like; a polyamide-based resin including polyamide resin 6, polyamide resin 66, polyamide resin 610, polyamide resin 612, polyamide resin 11, polyamide resin 12 or the like; a polyolefin-based resin including a polymer or a copolymer of α-olefin such as polyethylene or polypropylene, or the like can be used.

Among these resins, a polyester-based resin is suitably used, and among polyester-based resins, a polyethylene terephthalate-based resin, a polybutylene terephthalate-based resin, or a plant-derived polyester-based resin are more preferably used, and a recycled resin of these resins can be also used. As the recycled resins of these, a recycled resin of a polyester-based resin, particularly a polyethylene terephthalate-based resin, is preferred.

The resin substrate may be one layer, or may have a layered structure including two or more layers, and when the layered structure is employed, the layers may have the same composition or different compositions.

Besides, when the layered structure is employed, an adhesive layer or the like may be formed among the layers for adhesion.

(Polybutylene Terephthalate (PBT) Film)

Since a polybutylene terephthalate film has a high heat distortion temperature, is excellent in mechanical strength and electric characteristics, and is good at moldability, when it is used for a packaging bag for holding a content of food or the like, it is possible to suppress deformation of the packaging bag and deterioration of the strength in performing a retort treatment.

The polybutylene terephthalate film has high strength. Therefore, when the polybutylene terephthalate film is used, piercing resistance can be imparted to the packaging bag in the same manner as in a case where a packaging material forming the packaging bag includes a nylon film.

Besides, the polybutylene terephthalate film hydrolyzes under a high temperature and high humidity environment to degrade in adhesion strength and a barrier property after a retort treatment, but has a property of less absorbing moisture than nylon. Therefore, even when the polybutylene terephthalate film is formed on an outer surface of a packaging material, deterioration in laminate strength between packaging materials of the packaging bag can be suppressed. Owing to these characteristics, the polybutylene terephthalate film is preferably used for a retort packaging bag because such a packaging bag can be used instead of a conventional laminated packaging material of a polyethylene terephthalate film and a nylon film.

The polybutylene terephthalate film is a film containing, as a principal component, polybutylene terephthalate (hereinafter also referred to as PBT), and is a resin film containing preferably 51% by mass or more, and particularly preferably 60% by mass or more of PBT. The polybutylene terephthalate film is divided into two aspects in accordance with its structure.

A content of PBT in the polybutylene terephthalate film according to the first aspect is preferably 60% by mass or more, more preferably 70% by mass or more, particularly preferably 75% by mass or more, and most preferably 80% by mass or more.

The PBT used as a principal component contains, as a dicarboxylic acid component, preferably 90% by mole or more, more preferably 95% by mole or more, further preferably 98% by mole or more, and most preferably 100% by mole of terephthalic acid. It contains, as a glycol component, preferably 90% by mole or more, more preferably 95% by mole or more, and further preferably 97% by mole or more of 1,4-butanediol.

The polybutylene terephthalate film may contain another polyester resin in addition to PBT. Examples of the polyester resin used in addition to PBT include polyester resins such as PET, polyethylene naphthalate (PEN), polybutylene naphthalate (PBN), and polypropylene terephthalate (PPT), a PBT resin copolymerized with dicarboxylic acid such as isophthalic acid, orthophthalic acid, naphthalenedicarboxylic acid, biphenyl dicarboxylic acid, cyclohexanedicarboxylic acid, adipic acid, azelaic acid, or sebacic acid, and a PBT resin copolymerized with a diol component such as ethylene glycol, 1,3-propylene glycol, 1,2-propylene glycol, neopentyl glycol, 1,5-pentanediol, 1,6-hexanediol, diethylene glycol, cyclohexanediol, polyethylene glycol, polytetramethylene glycol, or polycarbonate diol.

A content of the polyester resin used in addition to PBT is preferably 40% by mass or less. When the content of the polyester resin used in addition to PBT exceeds 40% by mass, mechanical properties as PBT are impaired, so that impact strength, pinhole resistance, and drawability may be insufficient.

The layer structure of the polybutylene terephthalate film according to the first aspect is produced by forming layers of resins and casting the resultant by a cast method, and includes a layered structure portion including a plurality of unit layers. Each of the plurality of unit layers contains PBT as a principal component. For example, each of the plurality of unit layers contains 60% by mass or more of PBT. It is noted that the (n+1)th unit layer is directly laminated on the nth unit layer in the plurality of unit layers. In other words, an adhesive layer or an adhering layer is not formed among the plurality of unit layers. Such a polybutylene terephthalate film includes the layered structure portion including at least 10 layers or more, preferably 60 layers or more, more preferably 250 layers of more and further preferably 1000 layers or more of unit layers.

The polybutylene terephthalate film according to the second aspect includes a single layer containing polyester using PBT as a principal repeating unit. The polyester using PBT as a principal repeating unit contains, for example, 1,4-butanediol or an ester-forming derivative thereof as a glycol component, and terephthalic acid or an ester-forming derivative thereof as a dicarboxylic acid component, as principal components, and encompasses a homo- or copolymer type polyester obtained by condensing these. A content of PBT according to the second aspect is preferably 70% by mass or more, more preferably 80% by mass or more, and most preferably 90% by mass or more.

The polybutylene terephthalate film according to the second aspect may contain another polyester resin, in addition to PBT, in a range of 30% by mass or less. When such a polyester resin is contained, crystallization of PBT can be suppressed, and stretchability of the polybutylene terephthalate film can be improved. As a polyester resin to be blended with PBT, a polyester using ethylene terephthalate as a principal repeating unit can be used. For example, a homo type resin containing, as principal components, ethylene glycol as a glycol component and terephthalic acid as a dicarboxylic acid component can be preferably used.

The polybutylene terephthalate film according to the second aspect can be produced by a tubular method or a tenter method. The tubular method or the tenter method may be employed for stretching an unstretched raw material simultaneously in the lengthwise direction and the widthwise direction, or for stretching successively in the lengthwise direction and the widthwise direction. Among these methods, the tubular method is particularly preferably employed because a stretched film well balanced in properties in the circumferential direction can be obtained.

(Biomass-Derived Polyester Film)

A biomass-derived polyester film contains a resin composition containing, as a principal component, polyester consisting of a diol unit and a dicarboxylic acid unit, the resin composition is preferably a resin composition consisting of a diol unit of biomass-derived ethylene glycol and a dicarboxylic acid unit of a fossil fuel-derived dicarboxylic acid, and is more preferably a resin composition consisting of biomass-derived ethylene glycol and fossil fuel-derived terephthalic acid.

Since biomass-derived ethylene glycol has the same chemical structure as conventional fossil fuel-derived ethylene glycol, a film of polyester synthesized using the biomass-derived ethylene glycol is not inferior to a conventional fossil fuel-derived polyester film in mechanical properties and the like. Accordingly, since the barrier resin film of the present invention using a biomass-derived polyester film includes layers of carbon neutral materials, the amount of fossil fuel used can be reduced and an environmental load can be reduced as compared with a barrier resin film produced from a conventional raw material obtained from fossil fuel.

The biomass-derived ethylene glycol is obtained by using, as a raw material, ethanol produced as a raw material of biomass such as sugar cane or corn (biomass ethanol). Biomass ethanol can be obtained by a conventionally known method, and for example, a method for generating ethylene glycol via ethylene oxide or the like can be employed for obtaining biomass-derived ethylene glycol. Alternatively, commercially available biomass ethylene glycol may be used, and for example, biomass ethylene glycol commercially available from India Glycols Limited can be suitably used.

As a dicarboxylic acid component of polyester, fossil fuel-derived dicarboxylic acid is used. As the dicarboxylic acid, aromatic dicarboxylic acid, aliphatic dicarboxylic acid and derivatives thereof can be used. Examples of the aromatic dicarboxylic acid include terephthalic acid and isophthalic acid, and examples of derivatives of aromatic dicarboxylic acid include lower alkyl esters, specifically, methyl ester, ethyl ester, propyl ester and butyl ester, of aromatic dicarboxylic acid. Among these, terephthalic acid is preferred, and a derivative of aromatic dicarboxylic acid is preferably dimethyl terephthalate.

As the resin substrate of the present invention, a single film of biomass-derived polyester can be used. Alternatively, a film of a resin containing biomass-derived polyester, and one, two or more of fossil fuel-derived polyester, recycled polyester of a fossil fuel-derived polyester product, and recycled polyester of a biomass-derived polyester product can be used.

Since carbon dioxide in the air contains $^{14}C$ in a prescribed ratio (105.5 pMC), it is known that a plant growing with carbon dioxide in the air taken in, such as corn, has a $^{14}C$ content of about 105.5 pMC. Besides, it is also known that fossil fuel minimally contains $^{14}C$. Accordingly, when a ratio of $^{14}C$ contained in all carbon atoms of polyester is measured, a ratio of biomass-derived carbon can be calculated.

In the present invention, the term "biomass degree" refers to a weight ratio of a biomass-derived component. Taking PET as an example, since PET is obtained by polymerizing ethylene glycol containing 2 carbon atoms and terephthalic acid containing 8 carbon atoms in a molar ratio of 1:1, when merely biomass-derived ethylene glycol is used, a weight ratio of a biomass-derived component in the PET is 31.25%, and hence its biomass degree is 31.25% (molecular weight derived from biomass-derived ethylene glycol/molecular weight of single polymerization unit of polyester=60≈192).

Besides, a weight ratio of a biomass-derived component in fossil fuel-derived polyester is 0%, and hence a biomass degree of the fossil fuel-derived polyester is 0%. In the present invention, a biomass degree in the plastic substrate is preferably 5.0% or more, more preferably 10.0% or more, and preferably 30.0% or less.

(Recycled PET)

As the resin substrate of the present invention, a substrate containing polyester terephthalate (hereinafter sometimes also referred to as PET) recycled by mechanical recycling can be used.

Specifically, the resin substrate contains PET recycled by mechanical recycling of PET bottles, and in this PET, a diol component is ethylene glycol, and a dicarboxylic acid component contains terephthalic acid and isophthalic acid.

Here, mechanical recycling refers to, in general, a method in which a resin product made of a PET resin is cleaned to be restored to a PET resin by crushing recovered polyethylene terephthalate resin products such as PET bottles, alkali cleaning the resultant to remove stains and foreign substances remaining on surfaces of the PET resin products, and drying the resultant at a high temperature under reduced pressure for a prescribed period of time to diffuse and decontaminate contaminants remaining inside the PET resins.

Hereinafter, polyethylene terephthalate obtained by recycling PET bottles is referred to as "recycled polyethylene terephthalate (hereinafter sometimes also referred to as recycled PET)", and polyethylene terephthalate not recycled is referred to as "virgin polyethylene terephthalate (hereinafter sometimes also referred to as virgin PET)".

In the PET contained in the resin substrate, a content of an isophthalic acid component is preferably 0.5% by mole or more and 5% by mole or less, and more preferably 1.0% by mole or more and 2.5% by mole or less based on all dicarboxylic acid components contained in the PET.

When the content of the isophthalic acid component is less than 0.5% by mole, flexibility is not improved in some cases, and on the other hand, when the content exceeds 5% by mole, a melting point of the PET is lowered and hence heat resistance is insufficient in some cases.

It is noted that PET may be usual fossil fuel-derived PET or biomass PET. The "biomass PET" contains biomass-derived ethylene glycol as a diol component, and fossil fuel-derived dicarboxylic acid as a dicarboxylic acid component. The biomass PET may be made of merely PET containing biomass-derived ethylene glycol as a diol component and fossil fuel-derived dicarboxylic acid as a dicarboxylic acid component, or may be made of PET containing biomass-derived ethylene glycol and fossil fuel-derived diol as a diol component, and fossil fuel-derived dicarboxylic acid as a dicarboxylic acid component.

PET used for a PET bottle can be obtained by a conventionally known method of polycondensation of the diol component and dicarboxylic acid component described above.

Specifically, it can be produced by a general melt polymerization method in which polycondensation is performed under reduced pressure after esterification and/or transesterification of the diol component and the dicarboxylic acid component, or a known solution heating dehydration condensation using an organic solvent.

An amount of the diol component used in producing the PET is substantially equivalent molar amount to 100 moles of dicarboxylic acid or a derivative thereof, but is, in general, excessive by 0.1% by mole or more and 20% by mole or less because of distillation occurring in esterification and/or transesterification and/or polycondensation.

Besides, polycondensation is preferably performed in the presence of a polymerization catalyst. Timing of adding the polymerization catalyst is not especially limited as long as it is before the polycondensation, and the catalyst may be added in charging raw materials, or in starting pressure reduction.

PET obtained by recycling PET bottles may be subjected to, after polymerization and solidification as described above, solid state polymerization, if necessary, for further increasing a degree of polymerization or removing an oligomer such as a cyclic trimer.

Specifically, solid polymerization is performed, after chipping and drying PET, by pre-crystallizing the PET by heating at a temperature of 100° C. or more and 180° C. or less for about 1 hour to 8 hours, and subsequently heating the resultant at a temperature of 190° C. or more and 230° C. or less for 1 hour to several tens hours in an inert gas atmosphere or under reduced pressure.

The PET contained in the recycled PET has a limiting viscosity of preferably 0.58 dl/g or more and 0.80 dl/g or less. When the limiting viscosity is less than 0.58 dl/g, mechanical characteristics required of a PET film as a resin substrate may be insufficient. On the other hand, when the limiting viscosity exceeds 0.80 dl/g, productivity in film forming process may be impaired. It is noted that the limiting viscosity is measured with an orthochlorophenol solution at 35° C.

The recycled PET preferably contains recycled PET in a ratio of 50% by weight or more and 95% by weight or less, and may contain virgin PET in addition to the recycled PET.

The virgin PET may be PET containing ethylene glycol as a diol component and terephthalic acid and isophthalic acid as a dicarboxylic acid component as described above, or may be PET not containing isophthalic acid as a dicarboxylic acid component. Besides, the resin substrate layer may contain another polyester in addition to PET. For example, in addition to aromatic dicarboxylic acid such as terephthalic acid or isophthalic acid, aliphatic dicarboxylic acid or the like may be contained as a dicarboxylic acid component.

Specific examples of aliphatic dicarboxylic acid include chain or alicyclic dicarboxylic acids usually having 2 or more and 40 or less carbon atoms, such as oxalic acid, succinic acid, glutaric acid, adipic acid, sebacic acid, dodecanedioic acid, dimer acid, and cyclohexanedicarboxylic acid. Examples of a derivative of aliphatic dicarboxylic acid include a lower alkyl ester such as methyl ester, ethyl ester, propyl ester or butyl ester of the aliphatic dicarboxylic acid, and a cyclic acid anhydride of the aliphatic dicarboxylic acid such as succinic anhydride. Among these, the aliphatic dicarboxylic acid is preferably adipic acid, succinic acid, dimer acid or a mixture of these, and particularly preferably one containing succinic acid as a principal component. The derivative of the aliphatic dicarboxylic acid is more preferably methyl ester of adipic acid or succinic acid, or a mixture of these.

The resin substrate containing such PET may include a single layer or multiple layers.

When the above-described recycled PET is used in the resin substrate, the resin substrate may include three layers of a first layer 2a, a second layer 2b and a third layer 2c as illustrated in FIG. 2.

In this case, it is preferable that the second layer 2b is a layer containing the recycled PET alone or a mixed layer of the recycled PET and virgin PET, and that the first layer 2a and the third layer 2c are layers containing virgin PET alone.

When virgin PET alone is thus used in the first layer 2a and the third layer 2c, the recycled PET can be prevented from being exposed from a top surface or a rear surface of the resin substrate layer. Therefore, hygiene of a resultant laminate can be assured.

Alternatively, the resin substrate layer may be a resin substrate layer including two layers of the second layer 2b and the third layer 2c without providing the first layer 2a in FIG. 2. Alternatively, the resin substrate layer may be a resin substrate layer including two layers of the first layer 2a and the second layer 2b without providing the third layer 2c in FIG. 2. Also in these cases, it is preferable that the second layer 2b is a layer containing the recycled PET alone or a mixed layer of the recycled PET and virgin PET, and that the first layer 2a and the third layer 2c are layers containing virgin PET alone.

When the recycled PET and virgin PET are mixed to mold one layer, a method in which these are separately supplied to a molding machine, a method in which these are mixed by dry blending before supplying, or the like may be employed. In particular, from the viewpoint of operational easiness, the method in which these are mixed by dry blending is preferred.

The PET forming the resin substrate can contain various additives during production process or after the production as long as the characteristics are not impaired. Examples of the additives include a plasticizer, a ultraviolet stabilizer, an anti-coloring agent, a matting agent, a deodorant, a flame retardant, a weatherproofing agent, an antistatic agent, a thread friction reducing agent, a releasing agent, an antioxidant, an ion exchanger, and a color pigment. It is preferable that the additives are contained in a range of an amount of 5% by mass or more and 50% by mass or less, and preferably 5% by mass or more and 20% by mass or less in the whole resin composition including the PET.

The resin substrate can be formed by film formation using the PET by, for example, a T-die method. Specifically, after drying the PET, the resultant PET is supplied to a melt extruder heated to a range from a temperature equal to or higher than a melting point (Tm) of the PET to the temperature Tm+70° C. for melting the resin composition. The resultant is, for example, extruded using a die such as a T-die into a sheet shape, the extruded sheet shaped product is rapidly cooled and solidified using a rotating cooling drum or the like, and thus, a film can be molded. As the melt extruder, a single screw extruder, a twin screw extruder, a vent extruder, a tandem extruder or the like can be used in accordance with intended purpose.

The film obtained as described above is preferably biaxially stretched. Biaxial stretching can be performed by a conventionally known method. For example, the film extruded onto the cooling drum as described above is subsequently heated by roll heating, infrared heating or the like to be stretched in a longitudinal direction to obtain a longitudinally stretched film. This stretching is performed preferably by utilizing a peripheral speed difference among two or more rolls. The longitudinal stretching is usually performed in a temperature range of 50° C. or more and 100° C. or less. Besides, a draw ratio of the longitudinal stretching depends on characteristics required for the use of the film, and is preferably 2.5 times or more and 4.2 times or less. When the draw ratio is less than 2.5 times, thickness variation of the resultant PET film is so large that a good film is difficult to obtain.

The longitudinally stretched film is subsequently subjected to processing of lateral stretching, heat setting, and heat relaxing to be formed into a biaxially stretched film. The lateral stretching is performed usually in a temperature range of 50° C. or more and 100° C. or less. A draw ratio of the lateral stretching depends on characteristics required for the use, and is preferably 2.5 times or more and 5.0 times or less. When it is less than 2.5 times, thickness variation of the resultant film is so large that a good film is difficult to obtain, and when it exceeds 5.0 times, the film is easily ruptured during the formation.

After the lateral stretching, the heat setting treatment is subsequently performed, and a preferable temperature range for the heat setting is a temperature Tg of the PET+70° C. to the temperature Tm−10° C. Besides, a time for the heat setting is preferably 1 second or more and 60 seconds or less. For use requiring reduction of thermal shrinkage, the heat relaxing treatment may be performed if necessary.

A thickness of the PET film obtained as described above is arbitrary in accordance with the intended use, and is usually about 5 µm or more and 100 µm or less, and preferably 5 µm or more and 25 µm or less. Besides, breaking strength of the PET film is 5 kg/mm$^2$ or more and 40 kg/mm$^2$ or less in the MD direction, and 5 kg/mm$^2$ or more and 35 kg/mm$^2$ or less in the TD direction, and elongation at break is 50% or more and 350% or less in the MD direction and 50% or more and 300% or less in the TD direction. Furthermore, a shrinkage factor obtained when it is allowed to stand under a temperature environment of 150° C. for 30 minutes is 0.1% or more and 5% or less.

It is noted that virgin PET may be fossil fuel polyethylene terephthalate (hereinafter sometimes also referred to as fossil fuel PET), or biomass PET. Here, the "fossil fuel PET" contains fossil fuel-derived diol as a diol component, and fossil fuel-derived dicarboxylic acid as a dicarboxylic acid component. Besides, the recycled PET may be obtained by recycling PET resin products formed by using fossil fuel PET, or by recycling PET resin products formed by using biomass PET.

[Aluminum Oxide Deposited Film]

The aluminum oxide deposited film according to the present invention is a thin film of an inorganic oxide containing aluminum oxide as a principal component, and can contain a small amount of an aluminum compound such as single nitride, carbide or hydroxide of aluminum or a mixture thereof, a metal oxide such as silicon oxide, silicon nitride, silicon oxynitride, silicon carbide, magnesium oxide, titanium oxide, tin oxide, indium oxide, zinc oxide, or zirconium oxide, or a metal nitride or carbide of any of these or a mixture of these.

In the aluminum oxide deposited film according to the present invention, the elemental bond structure represented by $Al_3$ is distributed, and the abundance ratio of the elemental bond structure represented by $Al_3$ varies depending on a depth position in the aluminum oxide deposited film.

The abundance ratio of the elemental bond structure represented by $Al_3$ can be expressed as an existence proportion to $Al_2O_3$ (aluminum oxide), and specifically, can be expressed as an intensity ratio $Al_3/Al_2O_3$, that is, a ratio between intensity of $Al_3$ and intensity of $Al_2O_3$ detected by time-of-flight secondary ion mass spectrometry (TOF-SIMS).

In the aluminum oxide deposited film according to the present invention, there exists a maximum $Al_3$ concentration elemental bond structure having the intensity ratio $Al_3/Al_2O_3 \times 100$ of 1 or more and 20 or less. Therefore, denseness of the deposited film is improved to increase the gas barrier property.

Besides, the maximum $Al_3$ concentration elemental bond structure is preferably present in a depth position of 4% or more and 45% or less in the thickness of the aluminum oxide deposited film from the surface of the aluminum oxide deposited film opposite to the resin substrate.

When the above-described structure is employed, an aluminum oxide film having a degree of oxidation/hydroxylation is present as the uppermost surface of the aluminum oxide deposited film, and hence adhesion to the barrier coating layer is improved and the gas barrier property is improved.

Besides, when the maximum $Al_3$ concentration elemental bond structure is provided in the depth position of 4% or more and 45% or less in the thickness of the aluminum oxide deposited film, the denseness of the deposited film is improved, and in addition, a reaction easily occurs between a barrier coating material soaked in laminating the barrier coating layer and aluminum, and the adhesion to the barrier coating layer is further improved.

The thickness of the aluminum oxide deposited film is preferably 5 nm or more and 100 nm or less. When the thickness is smaller than this range, the barrier property tends to be insufficient, and when the thickness is larger than this range, rigidity of the aluminum oxide deposited film tends to become too high to easily cause peeling or the like.

[Method for Forming Aluminum Oxide Deposited Film]

In the present invention, the aluminum oxide deposited film is preferably formed on a surface of the resin film having been plasma treated, and the plasma treatment and a treatment for forming the aluminum oxide deposited film are performed by using, for example, a deposition apparatus 10 as illustrated in FIG. 4.

In the deposition apparatus 10, partition walls 35a to 35c are formed in a decompression chamber 12. The partition wall 35a to 35c form a resin substrate conveyance chamber 12A, a plasma pretreatment chamber 12B and a film forming chamber 12C, and in particular, the plasma pretreatment chamber 12B and the film forming chamber 12C are formed as spaces surrounded by the partition walls 35a to 35c, and in each of the chambers, an exhaust chamber is further formed if necessary.

(Oxygen Plasma Pretreatment)

In the present invention, adhesiveness between the aluminum oxide deposited film and the substrate is easily deteriorated because a metal component of the aluminum oxide deposited film is increased, but the adhesiveness between the aluminum oxide deposited film and the substrate can be increased by increasing, through oxygen plasma pretreatment, the degree of oxidation of the aluminum oxide deposited film in a portion on a side of the interface with the substrate.

Therefore, as a plasma material gas supplied in the oxygen plasma pretreatment, single oxygen or a mixed gas with an inert gas having a high oxygen partial pressure is preferably used.

In the plasma pretreatment chamber 12B, a plasma pretreatment roller 20 capable of conveying a resin substrate S to be pretreated and performing a plasma treatment is formed to be partly exposed to the resin substrate conveyance chamber 12A, and the resin substrate S moves to the plasma pretreatment chamber 12B while being wound.

The plasma pretreatment chamber 12B is constructed in such a manner that a space where plasma is generated can be separated from the other region and an opposing space can be efficiently evacuated, and thus, a plasma gas concentration can be easily controlled and the productivity is improved. A pretreatment pressure employed for formation under reduced pressure can be set to and retained at about 0.1 Pa to 100 Pa, and particularly preferably 1 to 20 Pa.

A conveyance speed of the resin substrate S is not especially limited, and from the viewpoint of production efficiency, can be set to at least 200 m/min to 1000 m/min, and particularly preferably 300 to 800 m/min.

The plasma pretreatment means includes plasma supply means and magnetic field forming means. The plasma pretreatment means confines the oxygen plasma P in the vicinity of the surface of the resin substrate S together with the plasma pretreatment roller 20. Specifically, the plasma supply means and the magnetic field forming means included in the plasma pretreatment means are formed along a surface in the vicinity of the outer peripheral of the pretreatment roller 20, so as to form a gap sandwiched between the pretreatment roller 20 and the magnetic field forming means including plasma supply nozzles 22a to 22c that supply a plasma material gas and work as electrodes for generating the plasma P, and a magnet 21 or the like for accelerating the generation of the plasma P.

A voltage applied between the pretreatment roller 20 and the plasma supply nozzles 22a to 22c is an AC voltage having a frequency of 10 Hz to 2.5 GHz and a voltage of 50 to 1000 V, and is a voltage in an arbitrary stable applied state obtained by input power control, impedance control or the like.

The plasma supply means of the plasma pretreatment means includes a material volatile supplying device 18 provided outside the decompression chamber 12 and connected to the plasma supply nozzles, and a material gas supply line through which the material gas supply is supplied from the device. The plasma material gas to be supplied is oxygen alone or a mixed gas of an oxygen gas and an inert gas supplied from a gas reservoir via a flow rate controller for measuring a flow rate of the gas. Examples of the inert gas include one or a mixed gas of two or more gases selected from the group consisting of argon, helium and nitrogen.

In the oxygen plasma pretreatment for obtaining the aluminum oxide deposited film of the present invention, a mixing ratio between an oxygen gas and the inert gas, oxygen gas/inert gas, is preferably 6/1 to 1/1, and more preferably 5/2 to 3/2.

When the mixing ratio is 6/1 to 1/1, film formation energy of deposited aluminum on the resin substrate is increased, and when it is 5/2 to 3/2, the degree of oxidation of the aluminum oxide deposited film is increased to assure the adhesiveness between the aluminum oxide deposited film and the substrate.

A plasma intensity per unit area employed in the present invention is 50 to 8000 $W \cdot sec/m^2$, and when it is 50 $W \cdot sec/m^2$ or less, the effect of the plasma pretreatment cannot be obtained, and when it is 8000 $W \cdot sec/m^2$ or more, deterioration of the resin substrate such as wastage, coloring and firing caused by the plasma tends to occur. In particular, the plasma intensity of the oxygen plasma pretreatment for obtaining the aluminum oxide deposited film of the present invention is preferably 100 to 1000 $W \cdot sec/m^2$.

(Formation of Deposited Film)

As a vapor deposition method for forming the deposited film, various vapor deposition methods selected from physical vapor deposition and chemical vapor deposition can be applied. A physical vapor deposition method can be selected from the group consisting a vapor deposition method, a sputtering method, an ion plating method, an ion beam assist method, and a cluster ion beam method, and a chemical vapor deposition method can be selected from the group consisting of a plasma CVD method, a plasma polymerization method, a thermal CVD method, and a catalytic reaction type CVD method. In the present invention, the vapor deposition method of the physical vapor deposition method is suitably employed.

In the deposited film forming apparatus, the resin substrate S formed in the film forming chamber 12C where the pressure is reduced, and having been subjected to the pretreatment by the plasma pretreatment apparatus is wound and conveyed with its surface to be treated formed outside, and the film forming roller 23 performing the film forming treatment and a target of a film forming source formed to oppose the film forming roller are evaporated to form the deposited film on the resin substrate surface.

The deposited film forming means 24 employs a resistance heating method, uses an aluminum metal wire as a vapor source of aluminum, and while oxidizing aluminum vapor by supplying oxygen, forms the aluminum oxide deposited film on the surface of the resin substrate S.

Oxygen may be supplied in the form of single oxygen or a mixed gas with an inert gas such as argon, and it is significant to adjust the amount of oxygen for forming the maximum $Al_3$ concentration elemental bond structure.

Besides, evaporation of aluminum can be performed by disposing a plurality of aluminum metal wires in the axial direction of the roller 23 in a vapor deposition vessel in a boat shape (designated as a "boat-type") and heating the wires by the resistance heating method.

In this manner, the metal material of aluminum is evaporated with supplied heat and heat amount adjusted, and an amount of supplied oxygen is adjusted for controlling the reaction between aluminum and oxygen, and thus, the aluminum oxide deposited film of the present invention can be formed.

(Methods for Obtaining Maximum Ratio $Al_3/Al_2O_3$ and Depth Position of Maximum $Al_3$ Concentration Elemental Bond Structure)

In the present invention, for obtaining the $Al_3$ concentration and the $Al_2O_3$ concentration in the aluminum oxide deposited film, and the depth position of the maximum $Al_3$ concentration elemental bond structure, the measurement is performed by TOF-SIMS for specifying the depth position of the maximum $Al_3$ concentration elemental bond structure, and calculating the intensity ratio $Al_3/Al_2O_3$.

TOF-SIMS (time-of-flight secondary ion mass spectrometry) is a mass spectrometry method for mass-separating secondary ions, by utilizing a difference in flight time (flight time being proportional to a square root of the weight), sputtered and released from a surface of a solid sample to be analyzed through irradiation of the sample with a primary ion beam emitted from a primary ion gun.

Here, by detecting secondary ion intensity while sputtering is proceeding, in time-shift data of ion intensity of the secondary ion, namely, an ion of an element to be detected or a molecular ion bonded to the element to be detected, transition time is converted into a depth, and thus, a concentration distribution of the element to be detected in the depth direction from the sample surface can be grasped.

The depth of a dent formed on the sample surface through the irradiation with primary ions is precedently measured by using a surface roughness meter, an average sputtering rate is calculated based on the depth of the dent and the transition time, and assuming that the sputtering rate is constant, the depth (sputtered amount) can be calculated based on irradiation time (namely, the transition time) or the number of irradiation cycles.

In the present invention, while the aluminum oxide deposited film of the laminate film is being repeatedly soft etched at a constant rate as described above by using a Cs (cesium) ion gun preferably for measuring down to a deep region, $Al_3$ and $Al_2O_3$ ions derived from the aluminum oxide deposited film layer and $C_6$ ions derived from the resin substrate layer are measured, and thus, the intensity ratio among these ions can be calculated.

Besides, by specifying an interface between the aluminum oxide deposited film layer and the resin substrate layer, it can be grasped which depth position, from the interface, the maximum value of detected ions is present. In other words, when a position where the intensity of $C_6$ ions becomes a half of the maximum value is defined as the interface between the resin substrate layer and the aluminum oxide layer, it can be grasped which depth position, in the aluminum oxide layer, the maximum value of the intensity of the detected ions is present.

Measurement results can be obtained in the form of a graph, for example, as illustrated in FIG. 5. In the graph of FIG. 5, the unit on the ordinate (intensity) corresponds to the intensity of measured ions, and the unit on the abscissa (cycle) corresponds to the number of times of performing the etching.

Then, the depth in the aluminum oxide deposited film, the $Al_3$ intensity and the $Al_2O_3$ intensity in each cycle can be obtained, the intensity ratio $Al_3/Al_2O_3$ can be obtained, and the intensity ratio $Al_3/Al_2O_3$ and a ratio of the depth to the thickness of the aluminum oxide deposited film layer can be calculated.

[Barrier Coating Layer]

The barrier coating layer mechanically/chemically protects the aluminum oxide deposited film as well as improves the barrier performance of the barrier resin film, and is formed adjacently to the aluminum oxide deposited film.

The barrier coating layer is formed from a barrier coating layer coating agent containing a metal alkoxide and a hydroxyl group-containing water-soluble resin. In the barrier coating layer, the metal alkoxide generates a condensation product, and may generate a co-condensate together with the hydroxyl group-containing water-soluble resin.

A mass ratio of the hydroxyl group-containing water-soluble resin/the metal alkoxide is preferably 5/95 or more and 20/80 or less, and more preferably 8/92 or more and 15/85 or less. When the mass ratio is smaller than this range, the barrier effect obtained by the barrier coating layer tends to be insufficient, and when the mass ratio is larger than this range, rigidity and brittleness of the barrier coating layer are easily increased.

The thickness of the barrier coating layer is preferably 150 nm or more and 800 nm or less. When the thickness is smaller than this range, the barrier effect obtained by the barrier coating layer tends to be insufficient, and when the thickness is larger than this range, the rigidity and brittleness are easily increased.

In the present invention, the barrier coating layer can be produced as follows.

First, the metal alkoxide, the hydroxyl group-containing water-soluble resin, a reaction accelerator (such as a sol gel method catalyst or an acid), and water used as a solvent and an organic solvent of alcohol or the like such as methyl alcohol, ethyl alcohol, or isopropanol are mixed to prepare a barrier coating layer coating agent composition.

Next, the barrier coating layer coating agent composition is applied and dried on the aluminum oxide deposited film by a normal method. Through this drying process, the condensation or co-condensation reaction further proceeds, and a coating film is formed. The applying operation may be repeatedly performed on the first coating film thus obtained so as to form a plurality of coating films including two or more layers.

Furthermore, the resultant is heated at a temperature in a range of 20 to 200° C., preferably 50 to 180° C., and at a temperature equal to or lower than the melting point of the resin substrate for 3 seconds to 10 minutes. Thus, the barrier coating layer of the barrier coating layer coating agent can be formed on the aluminum oxide deposited film.

It is noted that the formation of the barrier coating layer is preferably performed in-line after forming the aluminum oxide deposited film without being exposed to the air.

(Metal Alkoxide)

The metal alkoxide is represented by a general formula $R^1nM(OR^2)_m$ (wherein $R^1$ and $R^2$ represent a hydrogen atom or an organic group having 1 to 8 carbon atoms, M represents a metal atom, n represents an integer of 0 or more, m represents an integer of 1 or more, and n+m corresponds to a valence of M; plural $R^1$s or $R^2$s in one molecule may be the same or different).

Specific examples of the metal atom represented by M in the metal alkoxide include silicon, zirconium, titanium, aluminum, tin, lead and borane, and for example, an alkoxysilane using Si (silicon) as M is preferably used.

The alkoxysilane is represented by a general formula $R^1nSi(OR^2)_m$ (wherein n+m=4).

In the formula, specific examples of $OR^2$ include a hydroxyl group, alkoxy groups, a phenoxy group, or the like, such as a methoxy group, an ethoxy group, a n-propoxy group, a n-butoxy group, an i-propoxy group, a butoxy group, a 3-methacryloxy group, and a 3-acryloxy group.

In the formula, specific examples of $R^1$ include a methyl group, an ethyl group, a n-propyl group, an isopropyl group, a phenyl group, a p-styryl group, a 3-chloropropyl group, a trifluoromethyl group, a vinyl group, a γ-glycidoxypropyl group, a methacryl group, and a γ-aminopropyl group.

Specific examples of the alkoxysilane include various alkoxysilanes and phenoxysilanes such as tetramethoxysilane, tetraethoxysilane, tetrapropoxysilane, tetraisopropoxysilane, tetrabutoxysilane, tetraphenoxysilane, methyltrimethoxysilane, methyltriethoxysilane, methyltripropoxysilane, methyltributoxysilane, methyltriphenoxysilane, phenylphenoxysilane, ethyltrimethoxysilane, ethyltriethoxysilane, dimethyldimethoxysilane, dimethyldiethoxysilane, n-propyltrimethoxysilane, n-propyltriethoxysilane, isopropyltrimethoxysilane, isopropyltriethoxysilane, dimethyldiethoxysilane, diphenyldimethoxysilane, diphenyldiethoxysilane, vinyltrimethoxysilane, vinyltriethoxysilane, phenyltrimethoxysilane, phenyltriethoxysilane, p-styryltrimethoxysilane, 3-methacryloxypropylmethyldimethoxysilane, 3-methacryloxypropylmethyldiethoxysilane, 3-methacryloxypropyltrimethoxysilane, 3-methacryloxypropyltriethoxysilane, 3-acryloxypropyltrimethoxysilane, 3-acryloxypropyltriethoxysilane, 3-chloropropyltriethoxysilane, trifluoromethyltrimethoxysilane, and 1,6-bis(trimethoxysilyl)hexane.

An alkoxysilane in which $R^1$ is an organic group having a functional group such as a vinyl group, an epoxy group, a methacryl group, or an amino group is generally designated as a silane coupling agent.

Specific examples of the silane coupling agent include γ-glycidoxypropyltrimethoxysilane, γ-glycidoxypropylmethyldiethoxysilane, and β-(3,4-epoxycyclohexyl)ethyltrimethoxysilane, among which γ-glycidoxypropyltrimethoxysilane is suitable.

One of, or a mixture of two or more of the above-described metal alkoxides may be used, and in particular, a silane coupling agent is suitably used together. When a silane coupling agent is used together, the silane coupling agent is used preferably in an amount of 2% by mass or more and 15% by mass or less in the whole metal alkoxide.

(Hydroxyl Group-Containing Water-Soluble Resin)

In the present invention, the hydroxyl group-containing water-soluble resin is capable of dehydration co-condensation with the metal alkoxide, and has a saponification degree of preferably 90% or more and 100% or less, more preferably 95% or more and 100% or less, and further preferably 99% or more and 100% or less. When the saponification degree is lower than this range, hardness of the barrier coating layer is easily reduced.

Specific examples of the hydroxyl group-containing water-soluble resin include a polyvinyl alcohol-based resin, an ethylene-vinyl alcohol copolymer, and a polymer of a bifunctional phenol compound and a bifunctional epoxy compound, and one of these may be singly used, a mixture of two or more of these may be used, or a copolymer of these may be used. Among these, polyvinyl alcohol is preferred because of particularly excellent flexibility and affinity, and a polyvinyl alcohol-based resin is suitable.

Specifically, a polyvinyl alcohol-based resin obtained by saponifying polyvinyl acetate, or an ethylene-vinyl alcohol copolymer obtained by saponifying a copolymer of ethylene and vinyl acetate can be used.

Examples of such a polyvinyl alcohol-based resin include an RS resin manufactured by Kuraray Co., Ltd., "RS-110 (saponification degree=99%, polymerization degree= 1,000)", and "Gohsenol NM-14 (saponification degree=99%, polymerization degree=1,400)" manufactured by The Nippon Synthetic Chemical Industry Co., Ltd.

<Barrier Laminate>

A barrier laminate of the present invention includes, as illustrated in FIG. 3, the barrier resin film of the present invention, and at least a heat-sealable sealant layer laminated thereon, with or without an adhesive, as the uppermost surface of the resultant barrier laminate.

The barrier laminate can additionally include, if necessary, in the form of a layered structure, any of various functional layers having functions desired to be imparted to a packaging material, such as a light shielding layer for imparting a light shielding property, a printing layer for imparting decorativeness and printing, a design layer, a laser printed layer, and an absorbing/adsorbing layer for absorbing or adsorbing odor.

[Sealant Layer]

The sealant layer may be a single layer, or include multiple layers of two or more layers, and when it includes two or more layers, the layers may have the same composition or different compositions, can also include a layer containing a heat sealable resin alone or a layer not containing a heat sealable resin, can further include functional layers having various functions or an adhesive layer, and a layer corresponding to the uppermost layer on one surface of a resultant barrier packaging material preferably contains a resin excellent in heat sealability.

Besides, the sealant layer can appropriately contain one, two or more of various inorganic or organic additives such as an antioxidant, a UV absorber, a light stabilizer, an antistatic agent, an antiblocking agent, a flame retardant, a crosslinking agent, a colorant, a pigment, a lubricant, a filler, a reinforcing agent, and a modifier resin. A content of the additive can be arbitrarily set in a range from a minute amount to several tens % in accordance with intended purpose.

As the sealant layer, a resin film or a resin coating film using one, two or more heat sealable resins can be used.

<Barrier Packaging Material>

A barrier packaging material of the present invention is a packaging material produced from the barrier laminate.

<Barrier Package>

A barrier package of the present invention is produced from the barrier packaging material of the present invention.

A barrier package in the form of, for example, a pillow packaging bag, a three side sealed type, a four side sealed type, or a gusset type can be produced by heat sealing process for heat sealing the sealant layer of the barrier packaging material.

EXAMPLES

Example 1

<Formation of Aluminum Oxide Deposited Film>

First, a roll around which a polyester film (hereinafter referred to as the PET film) having a thickness of 12 μm used as the resin substrate was wound was prepared.

Next, a continuous deposited film forming apparatus in which a pretreatment section including a plasma pretreatment apparatus and a film forming section were separated from each other was used to introduce, onto a surface of the PET film on which a deposited film was to be provided, plasma from a plasma supply nozzle in the pretreatment section under plasma conditions described below to perform a plasma pretreatment at a conveyance speed of 400 m/min. In the film forming section to which the PET film was continuously conveyed, an aluminum oxide deposited film having a thickness of 12 nm was formed on the resultant plasma treated surface on the PET film by a reactive resistance heating method used as heating means by a vacuum deposition method under conditions described below, and thus, a roll around which a barrier resin film is wound was obtained, and various evaluations were performed.

(Conditions for Plasma Pretreatment)
Plasma intensity: 150 W·sec/m$^2$
Ratio of plasma forming gasses: oxygen/argon=2/1
Voltage applied between pretreatment drum and plasma supply nozzle: 340 V
Degree of vacuum in pretreatment section: 3.8 Pa
(Conditions for Aluminum Oxide Film Formation)
Degree of vacuum: $8.1 \times 10^{-2}$ Pa
Conveyance speed: 400 m/min
Oxygen gas supply amount: 8000 sccm <Preparation of Barrier Coating Agent for Barrier Coating Layer>

To a solution obtained by mixing 226 g of water, 39 g of isopropyl alcohol and 5.3 g of 0.5 N hydrochloric acid, and adjusting the resultant to pH 2.2, 167 g of tetraethoxysilane was added while cooling to 10° C., and thus, a solution A was prepared.

A solution B was prepared by mixing 23.3 g of polyvinyl alcohol having a saponification degree of 99% or more and a polymerization degree of 2400, 513 g of water and 27 g of isopropyl alcohol.

A solution obtained by mixing the solution A and the solution B in a weight ratio of 4.4:5.6 was used as a barrier coating agent.

<Production of Barrier Resin Film including Barrier Coating Layer>

The barrier coating agent prepared as described above was coated by spin coating on the aluminum oxide deposited film of the PET film. Thereafter, the resultant was heated in an oven at 180° C. for 60 seconds to form a barrier coating layer having a thickness of about 400 nm on the aluminum oxide deposited film, and thus, a barrier resin film including a barrier coating layer was obtained.

Example 2

A barrier resin film and a barrier resin film including a barrier coating layer were obtained in the same manner as in Example 1 except that the oxygen supply amount of the condition for aluminum oxide deposited film formation was changed to 10000 sccm.

Example 3

A barrier resin film and a barrier resin film including a barrier coating layer were obtained in the same manner as in Example 1 except that the pretreatment was not performed.

Example 4

A barrier resin film and a barrier resin film including a barrier coating layer were obtained in the same manner as in Example 1 except that a plant-derived polyester-based resin was used as the substrate and that the plasma intensity of the pretreatment was changed to 250 W·sec/m².

Comparative Example 1

A barrier resin film and a barrier resin film including a barrier coating layer were obtained in the same manner as in Example 1 except that the oxygen supply amount of the condition for aluminum oxide deposited film formation was changed to 20000 sccm.

<Evaluation Methods>

[Intensity Ratio $Al_3/Al_2O_3$ in TOF-SIMS] While a barrier resin film including a barrier coating layer is being repeatedly soft etched, from the side of the barrier coating layer of the barrier resin film, at a constant rate by a Cs (cesium) ion gun under measurement conditions described below by using a time-of-flight secondary ion mass spectrometer (manufactured by ION TOF, TOF. SIMSS), mass analysis of ions of $C_6$ (mass number of 72.00) derived from the resin substrate, $Al_3$ (mass number of 80.94) and $Al_2O_3$ (mass number of 101.94) derived from the aluminum oxide deposited film, and SiO2 (mass number of 59.96) derived from the coating layer was performed.

First, a position where the intensity of SiO2 corresponding to a constituent element of the barrier coating layer became a half of the barrier coating layer was defined as the interface between the barrier coating layer and the aluminum oxide deposited film, and subsequently, a position where $C_6$ corresponding to a constituting material of the resin substrate became a half of the layer portion was defined as the interface between the film substrate and the aluminum oxide deposited film, and a portion from the first interface to the second interface was defined as the aluminum oxide deposited film.

Then, a position corresponding to the highest intensity of $Al_3$ in the aluminum oxide deposited film was obtained, and based on the intensity ratio $Al_3/Al_2O_3$ between $Al_3$ intensity and $Al_2O_3$ intensity at the obtained position, the intensity ratio $Al_3/Al_2O_3$ corresponding to the maximum intensity of $Al_3$ and the ratio of the depth to the thickness of the aluminum oxide deposited film were calculated.

TOF-SIMS Measurement Conditions:
Type of primary ion: $Bi_3^{++}$ (0.2 pA, 100 μs)
Measurement area: 150×150 μm²
Type of etching gun: Cs (1 keV, 60 nA)
Etching area: 600×600 μm²
Etching rate: 10 sec/Cycle

[Oxygen Permeability]

An oxygen permeability measuring apparatus (manufactured by MOCON, OX-TRAN 2/21) was used, the barrier resin film including the barrier coating layer was set with the resin substrate side formed on a side for supplying oxygen, and oxygen permeability was measured in an atmosphere of 23° C. and 100% RH in accordance with JIS K7126 Method B.

[Steam Permeability]

A steam permeability measuring apparatus (manufactured by MOCON, PERMATRAN 3/33) was used, the barrier resin film including the barrier coating layer was set with the resin substrate side formed on a side of a sensor, and steam permeability was measured in an atmosphere of 37.8° C. and 100% RH in accordance with JIS K7126 Method B.

<Evaluation Results>

In each of Examples 1 to 4, the intensity ratio $Al_3/Al_2O_3 \times 100$ in the maximum $Al_3$ concentration elemental bond structure was 1 or more and 20 or less, the maximum $Al_3$ concentration elemental bond structure was present in a depth position of 4% or more and 45% or less in the thickness of the aluminum oxide deposited film, the oxygen permeability and the steam permeability were low, and a good gas barrier property was exhibited. Besides, stronger adhesiveness between the aluminum oxide deposited film and the resin substrate was attained in Examples 1, 2 and 4 where the plasma intensity was 150 W·sec/m² or more than in Example 3 where the plasma intensity was 0 (zero).

On the other hand, in Comparative Example 1, the intensity ratio in the maximum $Al_3$ concentration elemental bond structure was less than 1, and hence there is no maximum $Al_3$ concentration elemental bond structure satisfying the maximum intensity ratio of 1 or more and 20 or less, the oxygen permeability and the steam permeability were high, and a poor gas barrier property was exhibited.

TABLE 1

| | | | | Unit | Example 1 | Example 2 | Example 3 | Example 4 | Comparative Example 1 |
|---|---|---|---|---|---|---|---|---|---|
| Conditions | Oxygen Plasma Treatment Conditions | Oxygen Supply Amount | | sccm | 8000 | 10000 | 8000 | 8000 | 20000 |
| | | Oxygen/Inert Gas Ratio | | — | 2/1 | 5/2 | 2/1 | 2/1 | 5/1 |
| | | Plasma Intensity | | W·sec/m² | 150 | 150 | 0 | 250 | 150 |
| Evaluation Results | Aluminum Oxide Deposited Film | Thickness | | nm | 12 | 12 | 12 | 12 | 12 |
| | | Maximum $Al_3$ Concentration Elemental Bond Structure | Maximum Intensity Ratio $Al_3/Al_2O_3 \times 100$ | — | 5.1 | 3.7 | 4.5 | 4.9 | 0.8 |
| | | | Depth in Deposited Film | % | 10.6 | 24.5 | 25.6 | 23.4 | 5.3 |
| | Barrier Resin Film | Gas Barrier Property | Oxygen Permeability | cc/m²/day/atm | 0.07 | 0.09 | 0.07 | 0.08 | 0.2 |
| | | | Steam Permeability | g/m²/day | 0.08 | 0.09 | 0.09 | 0.08 | 0.5 |

REFERENCE SIGNS LIST 1 barrier resin film
2 resin substrate layer
2a first layer of resin substrate layer
2b second layer of resin substrate layer
2c third layer of resin substrate layer
3 aluminum oxide deposited film layer
4 barrier coating layer
5 barrier laminate.
6 sealant layer
10 roller type continuous deposited film forming apparatus
S resin substrate
P plasma
12 decompression chamber
12A resin substrate conveyance chamber
12B plasma pretreatment chamber
12C film forming chamber
14a to 14d guide roll
18 material volatile supplying device
20 pretreatment roller
21 magnet
22 plasma supply nozzle
23 film forming roller
24 deposited film forming means
31 power supply line
32 power supply
35a to 35c partition wall

The invention claimed is:

1. A barrier resin film comprising an aluminum oxide deposited film formed on a surface of a resin substrate, and a barrier coating layer adjacently formed on a surface of the aluminum oxide deposited film opposite to the resin substrate,
wherein an elemental bond structure represented by $Al_3$ is distributed in the aluminum oxide deposited film, and an intensity ratio, $Al_3/Al_2O_3 \times 100$, of a maximum $Al_3$ concentration elemental bond structure in the aluminum oxide deposited film obtained by analyzing the barrier resin film by time-of-flight secondary ion mass spectrometry (TOF-SIMS) is 1 or more and 20 or less.

2. The barrier resin film according to claim 1, wherein the maximum $Al_3$ concentration elemental bond structure is present in a depth position of 4% or more and 45% or less in a thickness of the aluminum oxide deposited film from the surface of the aluminum oxide deposited film opposite to the resin substrate.

3. The barrier resin film according to claim 1, wherein the surface of the resin substrate where the aluminum oxide deposited film is formed is an oxygen plasma treated surface.

4. The barrier resin film according to claim 3, wherein the aluminum oxide deposited film is formed in-line on the oxygen plasma treated surface.

5. The barrier resin film according to claim 1, wherein the resin substrate contains a polyethylene terephthalate-based resin.

6. The barrier resin film according to claim 1, wherein the resin substrate contains a polybutylene terephthalate-based resin.

7. The barrier resin film according to claim 1, wherein the resin substrate contains a plant-derived polyester-based resin.

8. The barrier resin film according to claim 1, wherein the resin substrate contains a recycled polyester-based resin.

9. The barrier resin film according to claim 1, wherein the barrier coating layer is formed from a resin composition containing a metal alkoxide, and a hydroxyl group-containing water-soluble resin having a saponification degree of 90% or more and 100% or less.

10. The barrier resin film according to claim 9, wherein a mass ratio between the hydroxyl group-containing water-soluble resin and the metal alkoxide, the hydroxyl group-containing water-soluble resin/the metal alkoxide, is 5/95 or more and 20/80 or less.

11. The barrier resin film according to claim 9, wherein the barrier coating layer has a thickness of 150 nm or more and 800 nm or less.

12. A barrier laminate comprising the barrier resin film according to claim 1, and a sealant layer.

13. A barrier packaging material produced from the barrier laminate according to claim 12.

14. A barrier package produced from the barrier packaging material according to claim 13.

* * * * *